United States Patent
Liu et al.

(10) Patent No.: US 7,018,560 B2
(45) Date of Patent: Mar. 28, 2006

(54) COMPOSITION FOR POLISHING SEMICONDUCTOR LAYERS

(75) Inventors: Zhendong Liu, Newark, DE (US); John Quanci, Haddonfield, NJ (US)

(73) Assignee: Rohm and Haas Electronic Materials CMP Holdings, Inc., Wilmington, DE (US)

( * ) Notice: Subject to any disclaimer, the term of this patent is extended or adjusted under 35 U.S.C. 154(b) by 239 days.

(21) Appl. No.: 10/634,437

(22) Filed: Aug. 5, 2003

(65) Prior Publication Data

US 2005/0031789 A1    Feb. 10, 2005

(51) Int. Cl.
   *C09K 13/06*       (2006.01)
(52) U.S. Cl. .................. 252/79.4; 252/79.1; 252/79.2; 252/79.3; 510/175; 510/254; 510/255; 510/257; 106/14.05
(58) Field of Classification Search ...... 252/79.1–79.5; 510/175, 176, 254, 255, 257; 106/14.05
   See application file for complete search history.

(56) References Cited

U.S. PATENT DOCUMENTS

| | | |
|---|---|---|
| 5,614,444 A | 3/1997 | Farkas et al. |
| 5,769,689 A | 6/1998 | Cossaboon et al. |
| 5,863,838 A | 1/1999 | Farkas et al. |

(Continued)

FOREIGN PATENT DOCUMENTS

EP       1 235 261 A1    8/2002

(Continued)

OTHER PUBLICATIONS

Wolf, Silicon Processing for the VLSI Era, 2002, Lattice Press, vol. 4, pp. 338-339.*

(Continued)

*Primary Examiner*—Nadine G. Norton
*Assistant Examiner*—Eric B. Chen
(74) *Attorney, Agent, or Firm*—Blake T. Biederman

(57) ABSTRACT

An aqueous polishing composition comprises a corrosion inhibitor for limiting removal of an interconnect metal with an acidic pH. The composition includes an organic-containing ammonium salt formed with

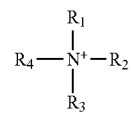

$R_1$, $R_2$, $R_3$ and $R_4$ are radicals, $R_1$ has a carbon chain length of 2 to 15 carbon atoms. The organic-containing ammonium salt has a concentration that accelerates TEOS removal and decreases removal of at least one coating selected from the group consisting of SiC, SiCN, $Si_3N_4$ and SiCO.

10 Claims, 6 Drawing Sheets

U.S. PATENT DOCUMENTS

| | | | |
|---|---|---|---|
| 6,001,730 A | 12/1999 | Farkas et al. | |
| 6,136,711 A | 10/2000 | Grumbine et al. | |
| 6,191,086 B1 * | 2/2001 | Leon et al. | 510/175 |
| 6,322,600 B1 | 11/2001 | Brewer et al. | |
| 6,361,712 B1 * | 3/2002 | Honda et al. | 252/79.3 |
| 6,376,361 B1 | 4/2002 | Chooi et al. | |
| 6,447,563 B1 * | 9/2002 | Mahulikar | 51/309 |
| 6,468,913 B1 | 10/2002 | Pasqualoni et al. | |
| 6,630,390 B1 * | 10/2003 | Andideh et al. | 438/427 |
| 6,749,488 B1 * | 6/2004 | Pasqualoni et al. | 451/41 |
| 6,776,696 B1 * | 8/2004 | Mahulikar et al. | 451/57 |
| 2002/0032987 A1 | 3/2002 | Steckenrider et al. | |
| 2002/0139055 A1 | 10/2002 | Asano et al. | |
| 2003/0064671 A1 | 4/2003 | Pasqualoni et al. | |
| 2003/0077985 A1 | 4/2003 | Zhou et al. | |
| 2004/0147118 A1 | 7/2004 | Liu et al. | |
| 2005/0029491 A1 | 2/2005 | Liu et al. | |

FOREIGN PATENT DOCUMENTS

| | | |
|---|---|---|
| WO | WO 99/67056 A1 | 12/1999 |
| WO | WO 00/24842 A1 | 5/2000 |

OTHER PUBLICATIONS

Wolf et al., Silicon Processing for the VLSI Era, 1986, Lattice Press, vol. 1, p. 184.*

Wolf, Silicon Processing for the VLSI Era, 2002, Lattice Press, vol. 4, pp. 368-369.*

* cited by examiner

COMPOSITION FOR POLISHING SEMICONDUCTOR LAYERS

BACKGROUND OF THE INVENTION

The disclosure relates to polishing compositions for modifying the removal rate of silicon oxide-containing layers in semiconductor devices. It also relates to chemical mechanical planarizing (CMP) processes for removing silicon oxide-containing layers from underlying layers, such as SiC, SiCN, $Si_3N_4$ or SiCO.

Chip fabricators use multiple chemical-mechanical-planarization (CMP) steps to planarize wafers to facilitate the production of flat substrate surfaces. These flat surfaces facilitate the production of multi-level integrated circuits without the detrimental distortion experienced from applying dielectric to uneven substrates.

The CMP process is typically carried out in a two-step sequence to improve polishing performance. First, the polishing process uses a "first-step" slurry specifically designed to rapidly remove the interconnect metal, such as copper. After this initial copper removal step, a "second-step" slurry removes the barrier layer. Typically, the second-step slurries have selectivity to remove the barrier layer without adversely impacting the physical structure or electrical properties of the interconnect structure by "dishing" the interconnect metal. The removal rate of the barrier versus the removal rate of the metal interconnect or the dielectric layer is known as the selectivity ratio. For purposes of this specification removal rate refers to a removal rate as change of thickness per unit time, such as, Angstroms per minute.

After removing the barrier layer, the slurry typically removes an underlying layer, such as a silicon oxide-containing material. For the purposes of this invention, silicon oxide-containing materials include materials derived from silanes such as tetratethylorthosilicate (TEOS) and other silicon oxide-containing coatings used to fabricate semiconductors other than SiCO or SiOC. Unfortunately, slurries that remove silicon oxide-containing materials at rapid removal rates tend to also remove underlying masks, caps, anti-reflective coatings and dielectrics, especially low k and ultra-low k dielectrics at unacceptable removal rates. The uncontrolled removal of these underlying layers can have a detrimental impact upon the integrated circuit's ultimate performance.

CMP polishing compositions have included alcohol amines for copper removal formulations. For example, Steckenrider et al., in U.S. Pub. No. 20020032987, disclose a metal polishing composition having a pH of 9 to 10.5, which contains an alcohol-amine. This composition has a polysilicon to insulating layer selectivity of greater than 100. These polishing compositions, however, utilize abrasive particles having sizes greater than or equal to 400 nanometers and do not display the requisite selectivity with respect to silicon oxide-containing layers, such as TEOS mask layers.

In several low k dielectric and ultra-low k integration schemes, depositing capping materials on top of the dielectrics protects the dielectrics from mechanical damage. Then above the capping layer a mask layer, such as TEOS, defines area for dielectric or interconnect metal within the integrated circuit by removing the mask layer with a patterned etch process. After etching, a barrier layer covers the substrate and then a metal layer, such as copper, fills the channels or vias. For efficacious CMP, these semiconductor integration schemes typically require the selective removal of mask layers, such as TEOS mask layers with low-level dishing of metal interconnects and minimal removal of a bottom capping layer. For some integrations schemes, however, it is advantageous to also remove the lower capping layer and stop on the low k dielectric.

Since silicon oxide-containing layers, such as TEOS, have higher dielectric constants than the low k and ultra-low k materials, it is advisable to keep these TEOS layers as thin as possible to maintain the wafer's low-effective dielectric constant. Because thicker TEOS layers improve process control for CMP integration, however, the ultimate thickness selected represents a compromise between these two competing functions. The "thick" TEOS layers resulting from this compromise require polishing composition with an efficient mask removal step with a controlled interconnect metal removal rate.

In summary, these semiconductor integration schemes require the selective removal of silicon oxide-containing layers with an effective removal rate and either stopping on the lower capping layer or on the dielectric. In view of these considerations, there is a desire to provide polishing compositions that permit controlled silicon oxide-containing layer removal. In addition, there is an ongoing desire to remove silicon oxide-containing layers, such as TEOS mask layers, with reduced defectivity.

In addition, since semiconductor fabricators rely upon different integration schemes and low k/ultra-low k materials, semiconductor customers have different requirements for the CMP slurries. These divergent integration schemes render formulating a universal polishing solution most difficult. Thus it is also efficacious to adjust the removal rate of silicon oxide-containing layers, cap layers, as well as the metal interconnect, such as copper to satisfy multiple integration schemes.

STATEMENT OF THE INVENTION

The invention provides an aqueous polishing composition comprising: a corrosion inhibitor for limiting removal of an interconnect metal; an acidic pH; and an organic-containing ammonium salt formed with $R_1$, $R_2$, $R_3$ and $R_4$ are radicals, $R_1$ has a carbon chain length of 2 to 15 carbon atoms and the organic-containing ammonium salt has a concentration that accelerates TEOS removal and decreases removal of at least one coating selected from the group consisting of SiC, SiCN, $Si_3N_4$ and SiCO with at least one polishing pressure less than 21.7 kPa.

The invention also includes a method for removing a layer from a semiconductor substrate comprising: applying an aqueous polishing composition to the semiconductor substrate, the aqueous polishing composition comprising an organic-containing ammonium salt formed with $R_1$, $R_2$, $R_3$ and $R_4$ are radicals, $R_1$ has a carbon chain length of 2 to 15 carbon atoms to accelerate removal of a silicon oxide-containing layer; and polishing the silicon oxide-containing layer from the semiconductor substrate with a polishing pad to remove silicon oxide-containing layer.

DETAILED DESCRIPTION

It has been found that ammonium salts facilitate controlled removal rate of silicon oxide-containing layers, such as TEOS layers at acidic pH levels, and thus permit controlling the silicon oxide-containing material's removal rate. The ammonium salts are organic ammonium salts formed with compounds to include the structure:

$R_1$, $R_2$, $R_3$ and $R_4$ are radicals that can be the same or different. The composition operates at acidic pH levels where the ammonium compound becomes ionized. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures comprising at least one of the foregoing anions. It is possible to add the salt directly to the composition or to form the salt in situ. For example, adding tetramethylammonium hydroxide to a nitric acid solution at a pH of 2.5 forms the tetramethylammonium nitrate.

A preferable ammonium salt combination is that formed from reacting tetrabutylammonium hydroxide with hydrofluoric acid. This combination reacts at low pH levels to form a tetrabutylammonium fluoride salt. Although the exact mechanism is unclear (The fluoride salt dissociates to provide fluoride ions in solution), having organic ammonium fluoride salts in solution further accelerates the TEOS removal rate.

$R_1$ is an organic that has a carbon chain length of 2 to 15 carbon atoms. More preferably, $R_1$ has a carbon chain length of 2 to 10. Most preferably, $R_1$ has a carbon chain length of 2 to 5 carbon atoms. The organic of $R_1$ may be a substituted or unsubstituted aryl, alkyl, aralkyl, or alkaryl group.

Preferably, $R_2$, $R_3$ and $R_4$ are an organic compound, such as, a substituted or unsubstituted aryl, alkyl, aralkyl, or alkaryl group; or hydrogen. If $R_2$, $R_3$ or $R_4$ is an organic compound, then the organic compound preferably has a carbon chain length of 2 to 15 carbon atoms; more preferably, it has a carbon chain length of 2 to 10 carbon atoms; and most preferably it has a carbon chain length of 2 to 5 carbon atoms.

Suitable compounds for forming ammonium salts include tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido) propyltrimethylammonium, triethylenetetramine, tetramethylguanidine, hexylamine and mixtures comprising at least one of the foregoing ammonium salts. Specific ammonium salts include tetraethyl ammonium nitrate, tetrabutylammonium fluoride, tetraethylammonium nitrate, tetraethylammonium fluoride, benzyltributylammonium chloride, benzyltrimethylammonium chloride, benzyltriethylammonium chloride, diallyldimethylammonium chloride, diallyldiethylammonium chloride, diethylaminoethyl methacrylate, dimethylaminoethyl methacrylate, methacryloyloxyethyltrimethylammonium sulfate, methacryloyloxyethyltrimethylammonium chloride, 3-(methacrylamido) propyltrimethylammonium chloride, triethylenetetramine, tetramethylguanidine, hexylamine and mixtures comprising at least one of the foregoing. The preferred ammonium salts are tetraethyl ammonium salts, tetrabutylammonium salts, benzyltributylammonium salts, benzyltrimethylammonium salts and benzyltriethylammonium salts.

The ammonium salts are present in an amount of 0.001 weight percent (wt %) to 3 wt %. For purposes of this specification, all concentrations have values expressed in weight percent based upon the total weight of the polishing composition, unless specifically noted otherwise. Preferably, the polishing composition is present in an amount of greater than or equal to 0.02 wt %, and preferably greater than or equal to 0.05 wt %. Also desirable within this range is an amount of less than or equal to 2, preferably less than or equal to 1, and more preferably less than or equal to 0.5 wt %.

The polishing composition may optionally contain up to 25 wt % abrasive to facilitate silica removal or combined barrier and silica removal—depending upon the integration scheme, the polishing composition may serve to remove the mask layer or to first remove a barrier layer and then remove a silicon oxide-containing layer. The polishing composition optionally includes an abrasive for "mechanical" removal of barrier layers. The abrasive is preferably a colloidal abrasive. Example abrasives include inorganic oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides such as polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is silica.

It is desired to use the abrasive in an amount of 0.05 wt % to 15 wt % based on the total weight of the polishing composition. Within this range, it is desirable to have the abrasive present in an amount of greater than or equal to 0.1 wt %, and preferably greater than or equal to 0.5 wt %. Also desirable within this range is an amount of less than or equal to 10 wt %, and preferably less than or equal to 5 wt %.

The abrasive has an average particle size of less than or equal to 150 nanometers (nm) for preventing excessive metal dishing and dielectric erosion. For purposes of this specification, particle size refers to the average particle size of the abrasive. It is desirable to use a colloidal abrasive having an average particle size of less than or equal to 100 nm, preferably less than or equal to 50 nm, and more preferably less than or equal to 40 nm. The least dielectric erosion and metal dishing advantageously occurs with colloidal silica having an average particle size of less than or equal to 40 nm. Decreasing the size of the colloidal abrasive to less than or equal to 40 nm, tends to improve the selectivity of the polishing composition; but it also tends to decrease the barrier removal rate. In addition, the preferred colloidal abrasive may include additives, such as dispersants, surfactants and buffers to improve the stability of the colloidal abrasive at acidic pH ranges. One such colloidal abrasive is colloidal silica from Clariant S. A., of Puteaux, France. The chemical mechanical planarizing composition can also optionally include complexing agents, chelating agents, pH buffers, biocides and defoaming agents.

If the polishing composition does not contain abrasives, then pad selection and conditioning become more important to the chemical mechanical planarizing (CMP) process. For example, for some abrasive-free compositions, a fixed abrasive pad improves polishing performance.

Optionally, the removal rate of barrier layers, such as tantalum, tantalum nitride, titanium and titanium nitride is advantageously optimized by the use of the oxidizing agent. Suitable oxidizers include, for example, hydrogen peroxide, monopersulfates, iodates, magnesium perphthalate, peracetic acid and other peracids, persulfates, bromates, periodates, nitrates, iron salts, cerium salts, manganese (Mn) (III), Mn (IV) and Mn (VI) salts, silver salts, copper salts, chromium salts, cobalt salts, halogens, hypochlorites, or combinations comprising at least one of the foregoing oxidizers. The preferred oxidizer is hydrogen peroxide. It is to be noted that the oxidizer is typically added to the polishing composition just prior to use and in such instances the oxidizer is contained in a separate package.

It is desirable to use an amount of 0 to 10 wt % oxidizer. Within this range, it is desirable to have oxidizer at an amount of greater than or equal to 0.1 wt %. Also desirable within this range is an amount of less than or equal to 5 wt % oxidizer. Most preferably, the composition contains 0.1 to 5 wt % oxidizer. Adjusting the amount of oxidizer, such as peroxide can also control the metal interconnect removal rate. For example, increasing the peroxide concentration increases the copper removal rate. Excessive increases in oxidizer, however, provide an adverse impact upon polishing rate.

The polishing composition has an acidic pH that produces a high barrier removal rate. Suitable metals used for the interconnect include, for example, copper, copper alloys, gold, gold alloys, nickel, nickel alloys, platinum group metals, platinum group metal alloys, silver, silver alloys, tungsten, tungsten alloys and mixtures comprising at least one of the foregoing metals. The preferred interconnect metal is copper. In acidic polishing compositions and slurries that utilize oxidizers such as hydrogen peroxide, both the copper removal rate and the static etch rate are high primarily because of oxidation of the copper. In order to reduce the removal rate of the interconnect metal the polishing composition employs a corrosion inhibitor. The corrosion inhibitors function to reduce removal of the interconnect metal. This facilitates improved polishing performance by reducing the dishing of the interconnect metal.

The inhibitor is typically present in an amount up to 6 wt %—the inhibitor may represent a single or a mixture of inhibitors to the interconnect metal. Within this range, it is desirable to have an amount of inhibitor greater than or equal to 0.0025 wt %, preferably greater than or equal to 0.25 wt %. Also desirable within this range is an amount of less than or equal to 4 wt %, preferably less than or equal to 1 wt %. The preferred corrosion inhibitor is benzotriazole (BTA). In one embodiment, the polishing composition may contain a relatively large quantity of BTA inhibitor for reducing the interconnect removal rate. At BTA concentrations above 0.25 wt %, an addition of supplemental corrosion inhibitors may be unnecessary. The preferred concentration of BTA is an amount of 0.0025 to 2 wt %.

Additional corrosion inhibitors include surfactants such as, for example, anionic surfactants, nonionic surfactants, amphoteric surfactants and polymers, or organic compounds, such as azoles. Suitable anionic surfactants include, for example, surfactants having a functional group, such as a sulfonate, a sulfate, a carboxylate, a phosphate, or a derivative of these functional groups, or combinations comprising at least one of the foregoing surfactants. A preferred anionic surfactant is sodium dodecylbenzenesulfonate. Suitable nonionic surfactants include, for example, silicon-based compounds, fluorine-based compounds, an ester, an ethylene oxide, an alcohol, an ethoxylate, an ether, a glycoside, or a derivative of these compounds, or a combination comprising at least one of the foregoing nonionic surfactants. Suitable amphoteric surfactants or polymers include, for example, polycarboxylates and their derivatives, polyacrylamides and their derivatives, cellulose, polyvinylalcohols and their derivatives, and polyvinylpyrrolidones and their derivatives. Suitable azoles that may be used as an inhibitor or in an inhibitor mixture include, for example, tolytriazole (TTA), imidazole and mixtures thereof. The most preferred secondary corrosion inhibitor is tolytriazole.

The polishing composition also includes an inorganic or an organic pH adjusting agent to reduce the pH of the polishing composition to an acidic pH less than or equal to 5. Suitable inorganic pH adjusting agents include, for example, nitric acid, sulfuric acid, hydrochloric acid, phosphoric acid, or combinations comprising at least one of the foregoing inorganic pH adjusting agents. The preferred pH-adjusting agent is nitric acid ($HNO_3$).

The polishing composition operates with an acidic pH. It is preferable to have the pH of the polishing composition less than or equal to 5. Within this range it is desirable to have a pH of greater than or equal to 1, preferably greater than or equal to 1.5. Also desirable within this range is a pH of less than or equal to 4, preferably less than or equal to 3. The most preferred pH for the polishing composition is 2 to 3.

At a pH below 3, the polishing composition can provide a high barrier metal removal rate, even with a relatively low weight percent of abrasive in the polishing composition. This low abrasive concentration can improve the polishing performance of a CMP process by reducing undesired abrasive induced defects, such as scratching. For example, a particle size of as small as approximately 10 nm still provides an acceptable barrier layer removal rate. By employing an abrasive having a relatively small particle size and formulating the polishing composition at a low abrasive concentration, polishing defects are further reduced.

Optionally, the polishing composition may contain a chelating or complexing agent to adjust the copper removal rate relative to the barrier metal removal rate. The chelating agent improves the copper removal rate by forming a chelated metal complex with copper. Suitable chelating agents include, for example, carboxylic acid, an aminocarboxylic acid and derivatives thereof, or combinations comprising at least one of the foregoing chelating agents. Preferably, the chelating agent is present in the polishing composition in an amount of less than or equal to 2 wt %, based on the total weight of the polishing composition. Optionally, the polishing composition can also include buffering agents such as various organic and inorganic acids, and amino acids or their salts with a pKa in the pH range of 1.5 to less than 3. Optionally, the polishing composition can further include defoaming agents, such as an non-ionic surfactants including esters, ethylene oxides, alcohols, ethoxylate, silicon compounds, fluorine compounds, ethers, glycosides and their derivatives. The defoaming agent may also be an amphoteric surfactant.

The polishing composition enables the CMP apparatus to operate with a low pressure of 2.5 to 15 kilopascals (kPa). Within this range, a pressure of 3 to 12 kPa, is preferred. The low CMP pad pressure improves polishing performance by reducing scratching and other undesired polishing defects and minimizes damage to fragile materials. For example, low dielectric constant materials fracture and delaminate when exposed to high stresses. Further, the high barrier metal removal rate obtained by the polishing composition enables effective barrier metal removal rates and silicon oxide-containing layer, such as TEOS, removal rates using a low abrasive concentration and a small abrasive particle size. In an exemplary embodiment, the polishing composition can be adjusted or tuned so as to advantageously achieve a high barrier removal rate without any destruction to the silicon oxide-containing layer. It can also advantageously be tuned to remove the silicon oxide-containing layer without any damage to the low k or ultra-low k dielectric layer.

The composition accelerates TEOS removal and decreases removal of at least one coating selected from the group consisting of SiC, SiCN, $Si_3N_4$ and SiCO for at least one polishing pressure of less than 21.7 kPa (3 psi) as measured with a porous-filled polyurethane polishing pad pressure measured normal to a wafer. Preferably the at least one coating selected from the group consisting of SiC, SiCN, $Si_3N_4$ and SiCO is a cap. For purposes of the specification, comparative removal refers to removal rates as measured with a porous-filled polyurethane polishing pad pressure measured normal to a wafer. A particular polishing pad useful for determining selectivity is the IC1010™ porous-filled polyurethane polishing pad. In addition, the composition has provided excellent selectivity at 6.9 kPa (1 psi). Since the composition will operate at a variety of polishing pressures, these data are for illustrating the efficacy of the composition, not for describing a specific operating pressure for the use of the composition. The polishing composition optionally has a TEOS to cap selectivity of at least 2 to 1 or at least 5 to 1 as measured with a porous-filled polyurethane polishing pad pressure measured normal to a wafer with at least one polishing pressure less than 21.7 kPa. The integration scheme selected controls TEOS selectivity.

In addition to mask to cap selectivity, the solution optionally has barrier removal selectivity with respect to metal interconnects—it removes barrier materials at a greater rate than metal interconnects, such as copper with a porous-filled polyurethane polishing pad pressure measured normal to a wafer with at least one polishing pressure less than 21.7 kPa. Optionally, the polishing composition has a tantalum nitride to copper selectivity of greater than or equal to 2 to 1 as measured with a porous-filled polyurethane polishing pad pressure measured normal to a wafer with at least one polishing pressure less than 21.7 kPa. Optionally, the polishing composition has a tantalum nitride to copper selectivity of greater than or equal to 5 to 1 as measured with a porous-filled polyurethane polishing pad pressure measured normal to a wafer with at least one polishing pressure less than 21.7 kPa. This high level of selectivity allows a chip manufacturer to remove material from the barrier layer without removing excess interconnect material.

Alternatively, the process may stop on the dielectric layer. Typical dielectric materials include silicon oxide-containing materials derived from silanes such as tetratethylorthosilicate (TEOS), low k and/or ultra-low k organic materials, CORAL® CVD SiOC commercially available from Novellus, BLACK DIAMOND® CVD SiOC commercially available from Applied Materials, dense SiLK® spin-on dielectric and porous SiLK® spin-on dielectric commercially available from Dow Chemicals, ZIRKON® spin-on porous SiOC commercially available from Shipley, AURORA® CVD SiOC commercially available from ASML and TEFLON® polytetrafluoroethylene commercially available from DuPont.

EXAMPLES

Example 1

The PL150H25 is a colloidal silica from Clariant, having 30 wt % silica particles with an average particle size of 25 nm.

This experiment was conducted to determine the polishing performance of the polishing composition at varying component concentrations. Polishing experiments were per formed using a Mirra® model polishing equipment supplied by Applied Materials. The polishing pad was an IC1010™ porous-filled polyurethane polishing pad supplied by Rodel, Inc. The pad was conditioned prior to each run. The polishing process was performed at a pressure of 6.9 kPa (1 psi), a table speed of 120 revolutions per minute (rpm) and a carrier speed of 114 rpm. The polishing composition supply rate was 180 ml/min.

It is to be noted in the following examples, that letters of the alphabet identify the comparative compositions, whereas the examples representing the polishing compositions are identified numerically. In this example, tetramethylammonium hydroxide and potassium nitrate were used to form comparative compositions to provide a comparison of the removal rate of simple cations with the ammonium salts having alkyl chains. Thus in Example 1, Sample A containing the control formulation—no ammonium salt addition, Samples B–D containing potassium nitrate and Samples E–G containing tetramethyl ammonium hydroxide were comparative compositions, while Samples 1–3 containing the ammonium salt tetraethyl ammonium nitrate (TEAN), Samples 4–6 containing tetrabutylammonium fluoride (TBAF), and Samples 7–9 containing tetrapentylammonium hydroxide (TPAH) represent the polishing composition.

Several polishing compositions shown in Table 1 were prepared to evaluate the polishing performance at varying concentration levels of select components and at a pH of 2.5. In the preparation of the polishing compositions the requisite amounts of all required chemicals as shown in Table 1 (with the exception of the hydrogen peroxide and the abrasive) were added to deionized water in a container. The solution in the container is stirred until all the ingredients are dissolved in water. The pH of the solution was then adjusted to approximately 2.5 by the addition of nitric acid. The abrasive was then added to the container. The final pH of the solution was then adjusted to 2.5 by the addition of nitric acid. Following this, the hydrogen peroxide was added to the container for use as a polishing composition. The samples of Tables 1 to 5 all included by weight percent, 0.6% BTA, 4% 25 nm silica (PL150H25) and 0.5% $H_2O_2$.

Figure 1:
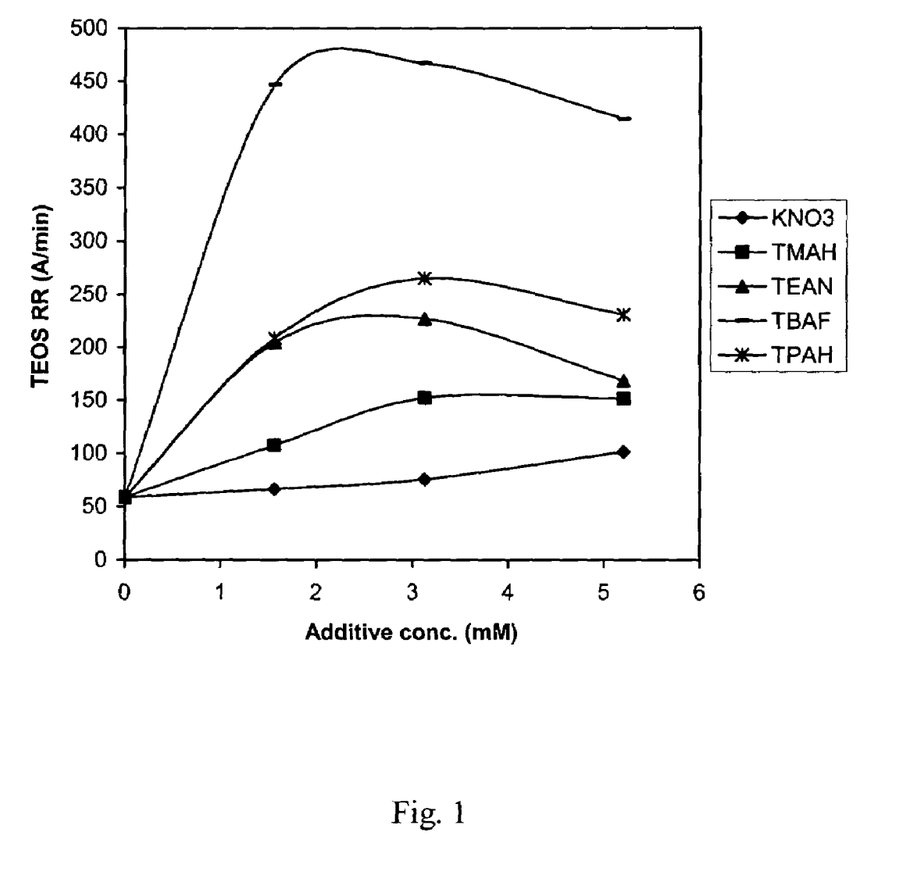
FIG. 1 is a graphical representation of the removal rate of TEOS versus the additive concentration of potassium nitrate and ammonium salts in the polishing composition.
Figure 2:
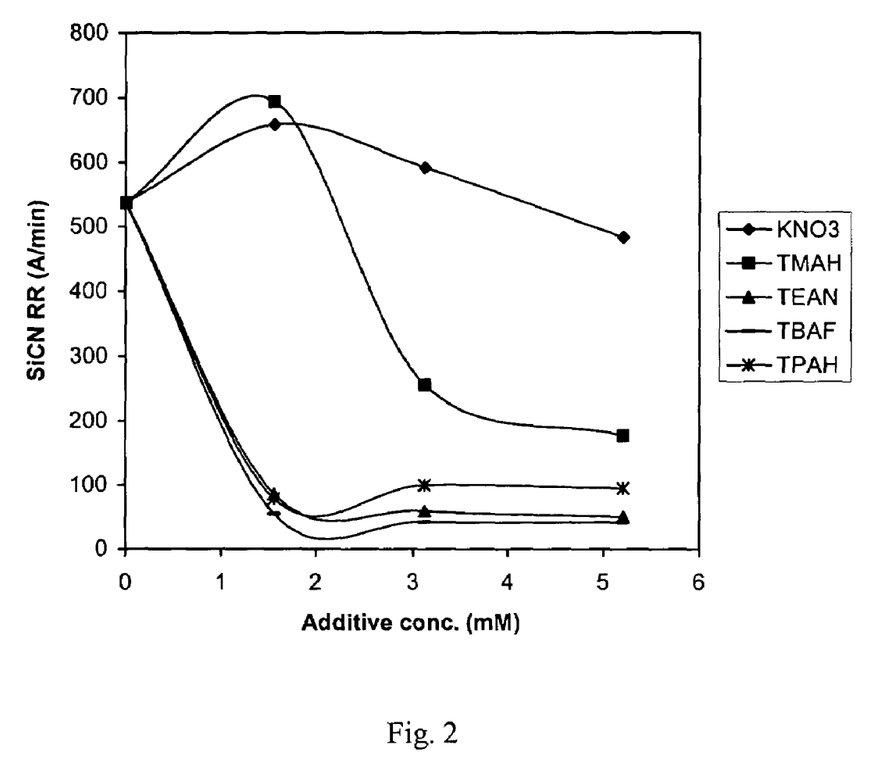
FIG. 2 is a graphical representation of the removal rate of silicon carbide nitride (SiCN) versus the molar additive concentration of potassium nitrate and ammonium salts in the polishing composition.

The results from Table 1 are shown in FIGS. 1 and 2 respectively. FIG. 1 is a graphical representation of the removal rate of TEOS versus the molar additive concentration of either the potassium nitrate, or the ammonium salts. (For purposes of illustrating differences within the ammonium salts, the Figures use molar concentrations rather than weight percent.) FIG. 2 is a graphical representation of the removal rate of silicon carbide nitride (SiCN) versus the molar additive concentration of either the potassium nitrate, or the ammonium salts. FIGS. 1 and 2 show that the removal rate for TEOS is increased with the increasing alkyl chain length of the ammonium salts up to tetrabutylammonium fluoride. Tetrabutylammonium fluoride has the highest TEOS removal rate and the lowest SiCN removal rate for all the ammonium salts examined. The relative flat TEOS and SiCN removal rate by increasing $KNO_3$ concentration indicates ionic strength of the solution did not cause the dramatic change of in the removal rate of TEOS or SiCN. It should be noted that the TEOS removal rate attained by TBAF is very high under the publishing processing conditions when compared with other commercial slurries using the same particle loading and polishing pressure.

Example 2

This example was conducted to further demonstrate that the high TEOS removal rate was not caused by the fluoride ion in the TBAF additive slurries. In this example, the comparative compositions H, I, and J comprise a fluoride ion. The fluoride ion was added to the polishing composition in the form of ammonium fluoride ($NH_4F$). As mentioned in example 1, comparative composition A contained the control formulation without any fluoride ion. The polishing composition is represented by Sample #10, which contained tetrabutylammonium fluoride. The polishing conditions were similar to those in Example 1. The formulations are shown in Table 2.

TABLE 1

| Sample | Additive | Addition by mM | Addition by wt. % | TaN RR | Cu RR | TEOS RR | SiCN RR | CDO RR | Zeta potential (mV) | Conductivity (S/m) |
|---|---|---|---|---|---|---|---|---|---|---|
| A |  |  |  | 808 | 190 | 59 | 537 | 109 | −10.17 | 0.14837 |
| B | $KNO_3$ | 1.56 mM | 0.0158 | 1181 | 147 | 67 | 659 | 100 | −8.45 | 0.154805 |
| C | $KNO_3$ | 3.12 mM | 0.0316 | 1100 | 107 | 76 | 592 | 90 | −7.31 | 0.162279 |
| D | $KNO_3$ | 5.21 mM | 0.0526 | 1042 | 154 | 102 | 483 | 92 | −6.01 | 0.197874 |
| E | TMAH | 1.56 mM | 0.0142 | 1079 | 86 | 108 | 694 | 172 | −4.88 | 0.14435 |
| F | TMAH | 3.12 mM | 0.0284 | 989 | 90 | 152 | 256 | 138 | −2.11 | 0.15842 |
| G | TMAH | 5.21 mM | 0.0474 | 927 | 131 | 152 | 177 | 118 | −0.65 | 0.16718 |
| 1 | TEAN | 1.56 mM | 0.03 | 873 | 70 | 204 | 86 | 119 | 1.83 | 0.14948 |
| 2 | TEAN | 3.12 mM | 0.06 | 829 | 64 | 227 | 59 | 98 | 1.84 | 0.14948 |
| 3 | TEAN | 5.21 mM | 0.1 | 784 | 70 | 169 | 50 | 87 | 6.93 | 0.16369 |
| 4 | TBAF | 1.56 mM | 0.0492 | 946 | 71 | 447 | 55 | 56 | 9.26 | 0.14487 |
| 5 | TBAF | 3.12 mM | 0.0984 | 918 | 84 | 467 | 42 | 45 | 11.74 | 0.14012 |
| 6 | TBAF | 5.21 mM | 0.164 | 1026 | 141 | 415 | 41 | 38 | 14.64 | 0.13602 |
| 7 | TPAH | 1.56 mM | 0.0493 | 707 | 102 | 209 | 79 | 116 | −2.47 | 0.14534 |
| 8 | TPAH | 3.12 mM | 0.0986 | 600 | 76 | 265 | 99 | 70 | 5.12 | 0.15722 |
| 9 | TPAH | 5.21 mM | 0.164 | 513 | 40 | 231 | 95 | 60 | 7.22 | 0.16381 |

TMAH: tetramethylammonium hydroxide
TEAN: tetraethylammonium nitrate
TBAF: tetrabutylammonium fluoride
TPAH: tetrapentylammonium hydroxide
RR = removal rate in angstroms per min

TABLE 2

| Sample | Additive | Addition by mM | Addition by wt. % | TaN RR | Cu RR | TEOS RR | SiCN RR | CDO RR |
|---|---|---|---|---|---|---|---|---|
| A |  |  |  | 653 | 109 | 41 | 614 | 138 |
| H | NH₄F | 1.56 mM | 0.00578% | 1074 | 108 | 67 | 648 | 163 |
| I | NH₄F | 3.12 mM | 0.0116% | 785 | 95 | 73 | 376 | 171 |
| J | NH₄F | 5.21 mM | 0.0193% | 793 | 97 | 81 | 272 | 133 |
| 10 | TBAF | 1.56 mM | 0.0492% | 816 | 72 | 518 | 78 | 77 |

The above data show quite conclusively that the samples that contain the ammonium fluoride do not display a high TEOS removal rate, while the sample that contains the TBAF displays a very high TEOS removal rate. In addition, comparing the results of Table 1 with Table 2 shows that while the ammonium salt affects the removal rate of TEOS and SiCN, the removal rate change of the other materials in the semiconductor substrate was reduced to a low level. This is important for CMP of ultra-low k integrated circuits. It allows different integration schemes for ultra-low-k CMP.

The polishing composition appears to shift the zeta potential of the silica to a higher value by absorbing onto the particle surface and making it positively charged at certain concentrations for higher alkyl chain chemicals. This composition may also affect the surface charge on the TEOS and capping layers in such a way that the charge repulsion between silica abrasives and TEOS layer on the integrated circuit is reduced, while the charge repulsion between the respective silica abrasives and capping layer is increased. The effect of different tetrammonium salts on the zeta potential of silica is shown in the Table 2 above, and in the FIG. 3.

Figure 3:
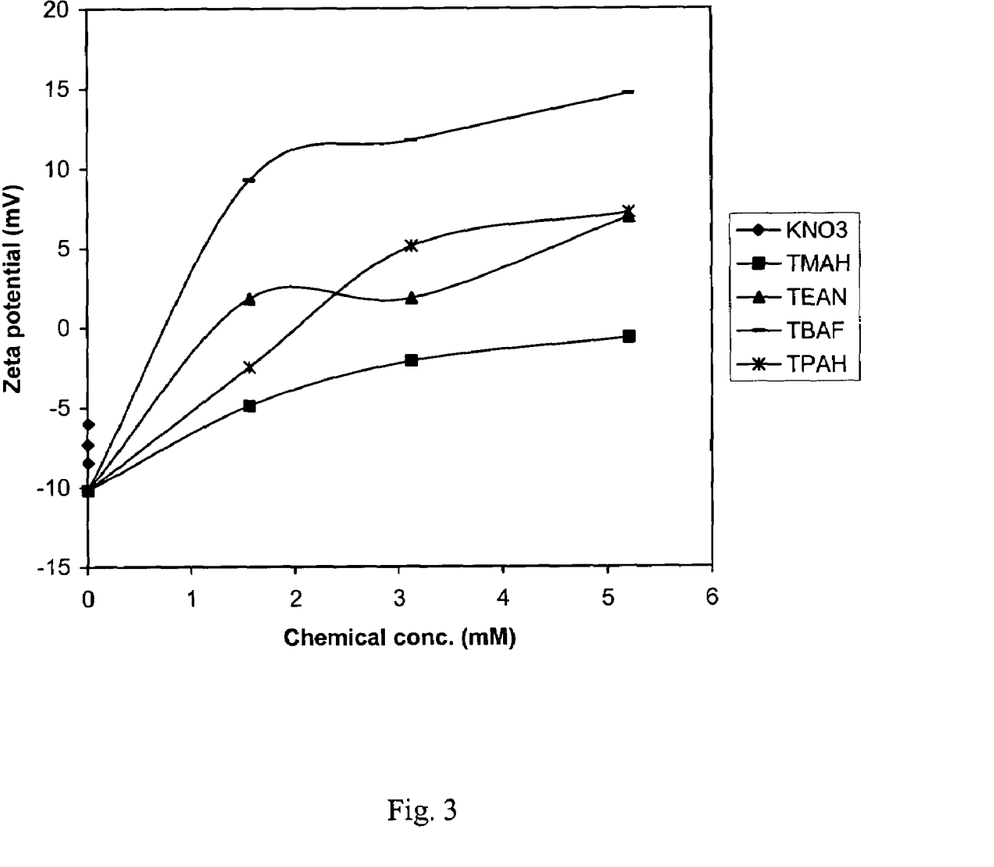
FIG. 3 is a graphical representation of the zeta potential of the initial polishing composition versus the concentration of potassium nitrate or ammonium salts in the initial polishing composition.

FIG. 3 is a graphical representation of the zeta potential of initial polishing composition versus the concentration of potassium nitrate or ammonium salts. The above diagram shows TBAF has the biggest influence on the zeta potential of the silica by shifting the charge to the highest positive values among all the ammonium salts. Accordingly, TBAF yields the highest TEOS removal rate and the lowest SiCN removal rate.

Example 3

This example was conducted to determine the effect of different ions on the removal rate of TEOS masks of the integrated circuit. Polishing experiments were performed using a Mirra model polishing equipment supplied by Applied Materials. The polishing pad was a Politex™ pad supplied by Rodel, Inc. The pad was conditioned prior to each run. The polishing process was performed at a membrane pressure of 10.33 kPa (1.5 psi), a table speed of 93 revolutions per minute (rpm) and a carrier speed of 87 rpm. The polishing composition supply rate was 180 m/min.

In this experiment, Sample A represents the control composition, while Samples 11–16 utilizing tetrabutylammonium nitrate and Samples 17–22 utilizing tetrabutylammonium fluoride represent the polishing compositions. The respective experimental compositions along with the results are shown in Table 3 below.

TABLE 3

| Sample | TBAN mM | TBAN wt % | TBAF mM | TBAF wt % | TaN RR | Cu RR | TEOS RR | SiCN RR | CDO RR |
|---|---|---|---|---|---|---|---|---|---|
| A |  |  |  |  | 1453 | 186 | 81 | 795 | 238 |
| 11 | 0.317 | 0.00965 |  |  | 1346 | 84 | 131 | 654 | 441 |
| 12 | 0.951 | 0.0290 |  |  | 1334 | 82 | 279 | 217 | 276 |
| 13 | 1.585 | 0.0483 |  |  | 1358 | 76 | 441 | 145 | 183 |
| 14 | 3.17 | 0.0965 |  |  | 1396 | 75 | 561 | 99 | 112 |
| 15 | 6.339 | 0.193 |  |  | 1304 | 92 | 500 | 91 | 108 |
| 16 | 12.678 | 0.386 |  |  | 1312 | 153 | 394 | 84 | 77 |
| 17 |  |  | 0.317 | 0.01 | 1333 | 97 | 164 | 483 | 367 |
| 18 |  |  | 0.951 | 0.03 | 1420 | 89 | 525 | 138 | 175 |
| 19 |  |  | 1.585 | 0.05 | 1461 | 89 | 696 | 104 | 124 |
| 20 |  |  | 3.17 | 0.1 | 1573 | 108 | 787 | 85 | 102 |
| 21 |  |  | 6.339 | 0.2 | 1659 | 149 | 633 | 72 | 96 |
| 22 |  |  | 12.678 | 0.4 | 1859 | 188 | 397 | 74 | 104 |

TBAF: tetrabutylammonium fluoride
TBAN: tetrabutylammonium nitrate

Figure 4:
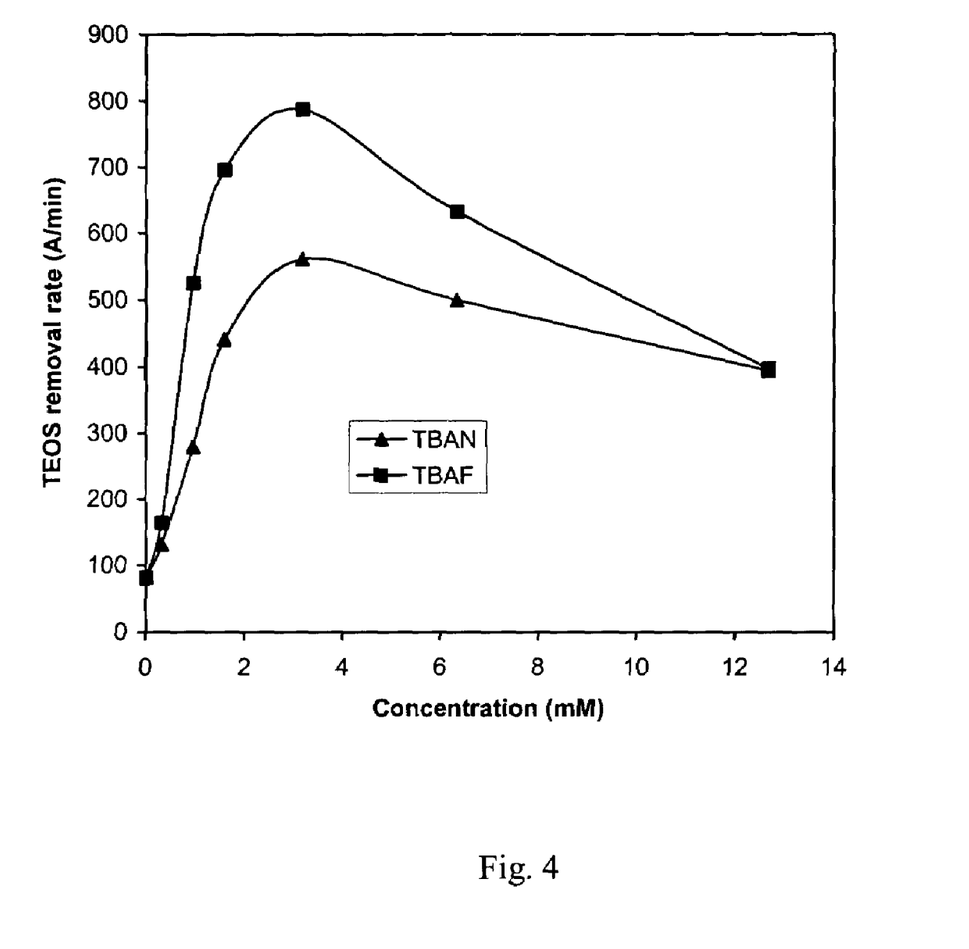
FIG. 4 is a graphical representation of the removal rate of TEOS versus the molar additive concentration of the ammonium salts in the initial polishing composition.
Figure 5:
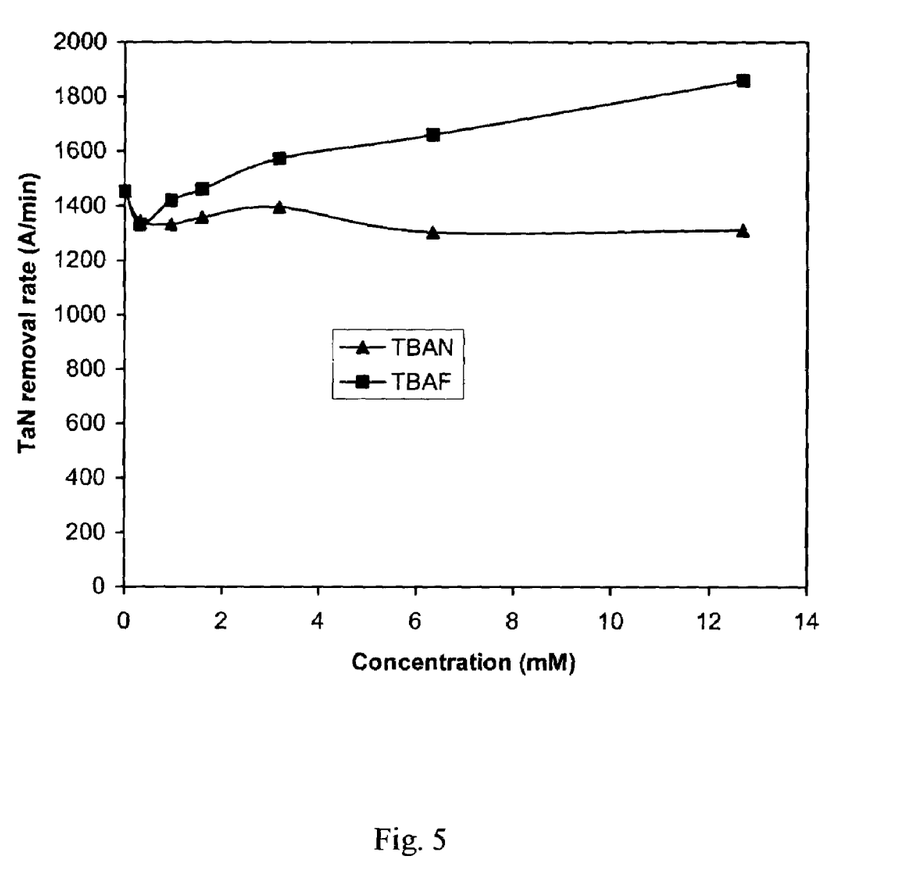
FIG. 5 is a graphical representation of the removal rate of tantalum nitride (TaN) versus the molar additive concentration of the ammonium salts in the initial polishing composition.

The above data indicate that the removal rate for TEOS is relatively higher when using fluoride ion to replace the nitrate ion of the ammonium salts. Also, increasing tetrabutylammonium fluoride concentration increased the barrier (TaN) removal rate, while tetrabutylammonium nitrate exhibits no significant effect on TaN rate. The comparison between TBAN and TBAF on TEOS and TaN removal rates is also shown graphically below in FIGS. 4 and 5 respectively. The data show that when compared with the TEOS layer removal rate data as seen in Table 2, the fluoride ion plays an important role in the removal rate of the TEOS and TaN layers when it is in the form of a quaternary ammonium

Example 4

This example was undertaken to demonstrate the use of other ammonium salts such as benzyltributylammonium chloride (BTBAC), benzyltrimethylammonium chloride (BTMAC), benzyltriethylammonium chloride (BTEAC). Sample A represents the control composition, while Samples 23–25 containing BTBAC, Samples 26–28 containing BTMAC and Samples 29–30 containing BTEAC represent the polishing compositions.

Polishing experiments were performed using polishing equipment having model number 6EC supplied by Strasbaugh. The polishing pad was an IC1010™ supplied by Rodel, Inc. The pad was conditioned prior to each run. The polishing process was performed at a pad pressure of 10.33 kPa (1.5 psi), a table speed of 93 revolutions per minute (rpm) and a carrier speed of 87 rpm. The polishing composition supply rate was 200 ml/min. The results are shown below in Table 4.

TABLE 4

| Sample | Additive | Addition by mM | Addition by wt. % | TaN RR | Cu RR | TEOS RR | CDO RR | Si$_3$N$_4$ RR | SiCN RR |
|---|---|---|---|---|---|---|---|---|---|
| A | | | | 1438 | 72 | 102 | 244 | 523 | 1030 |
| 23 | BTBAC | 0.95 mM | 0.0283% | 1176 | 63 | 543 | 174 | 172 | 227 |
| 24 | BTBAC | 3.17 mM | 0.0943% | 1123 | 85 | 714 | 102 | 91 | 187 |
| 25 | BTBAC | 12.7 mM | 0.377% | 1193 | 96 | 462 | 88 | 66 | 143 |
| 26 | BTMAC | 0.95 mM | 0.0231% | 1179 | 63 | 366 | 264 | 259 | 384 |
| 27 | BTMAC | 3.17 mM | 0.0769% | 1148 | 70 | 483 | 162 | 110 | 201 |
| 28 | BTMAC | 12.7 mM | 0.0307% | 1065 | 75 | 245 | 130 | 94 | 89 |
| 29 | BTEAC | 0.95 mM | 0.0169% | 1198 | 53 | 528 | 214 | 230 | 306 |
| 30 | BTEAC | 3.17 mM | 0.0563% | 466 | 70 | 641 | 135 | 34 | 202 |

BTBAC: benzyltributylammonium chloride
BTMAC: benzyltrimethylammonium chloride
BTEAC: benzyltriethylammonium chloride From the above table it may be seen that these ammonium salts can be used to vary the removal rate of the mask layers such as TEOS and capping layers such as, silicon nitride (Si$_3$N$_4$) and SiCN, while keeping the removal rate of barrier layers such as TaN in Samples 23–29 relatively unchanged.

Example 5

This example demonstrates the use of partially hydrogen-substituted ammonium salts such as triethylenetetramine, tetramethylguanidine and hexylamine. Sample A represent the comparative control composition, while Samples 31–32 containing triethylenetetramine, Samples 33–34 containing tetramethylguanidine, Samples 35–36 containing hexylamine and Sample 37 containing TBAN represent the polishing compositions.

Polishing experiments were performed using polishing equipment having model number 6EC supplied by Strasbaugh. The polishing pad was an IC1010™ porous-filled polyurethane polishing pad supplied by Rodel, Inc. The pad was conditioned prior to each run. The polishing process was performed at a backpressure of 10.33 kPa (1.5 psi), a table speed of 93 revolutions per minute (rpm) and a carrier speed of 87 rpm. The polishing composition supply rate was 200 ml/min. The results are shown below in Table 5.

TABLE 5

| Sample | Additive | Addition by mM | Addition by wt. % | TaN RR | Cu RR | TEOS RR | CDO RR | Si$_3$N$_4$ RR | SiCN RR |
|---|---|---|---|---|---|---|---|---|---|
| A | | | | 1438 | 72 | 102 | 244 | 523 | 1030 |
| 31 | Triethylenetetramine | 4.9 mM | 0.1% | 1283 | — | 312 | 262 | 242 | — |
| 32 | Triethylenetetramine | 24.48 mM | 0.5% | 1480 | 134 | 308 | 222 | 283 | 400 |
| 33 | Tetramethylguanidine | 0.868 | 0.01% | 1259 | 75 | 409 | 194 | 102 | 295 |
| 34 | Tetramethylguanidine | 86.8 mM | 1% | 1251 | 104 | 212 | 149 | 95 | 161 |
| 35 | Hexylamine | 19.76 mM | 0.2% | 1200 | 87 | 280 | — | 107 | 277 |
| 36 | Hexylamine | 59.29 mM | 0.6% | 1278 | 100 | 251 | — | 92 | 213 |
| 37 | Tetrabutylammonium nitrate | 3.284 mM | 0.1% | 1447 | 68 | 765 | — | 80 | 72 |

From the above table it is seen that ammonium salts formed from these amine compounds can also be used to vary the removal rate of the mask layers such as TEOS and capping layers such as silicon nitride (Si$_3$N$_4$) and SiCN, while keeping the removal rate of barrier layers, such as, TaN in Samples 31–36 relatively unchanged. Although ammonium salts formed from these amine compounds have effective removal rates, as seen above, tetrabutylammonium salts (sample 37) have a greater TEOS removal rate and TEOS to cap selectivity.

Example 6

This experiment was conducted on a Mirra model polishing equipment supplied by Applied Materials. The polishing pad was an IC1010™ supplied by Rodel, Inc. The pad was conditioned prior to each run. The polishing process was performed at a pressure of 10.3 kPa (1.5psi), a table speed of 93 revolutions per minute (rpm) and a carrier speed of 87 rpm. The CMP composition supply rate (slurry flow rate) was 200 milliliters/minute (ml/min). The copper sheet wafers for the defectivity test were first pre-polished by a commercially available slurry EPL2362 (Eternal) for 1 minute using a CUP4410 pad (supplied by Rodel, Inc.) and process parameters of 3 psi, 93 rpm table speed, 87 rpm carrier speed and 200 ml/min slurry flow rate. This step is to create a fresh copper surface. Then the pre-polished copper sheet wafers were polished by the slurry composition 16 and the conventional alkaline slurry.

After polishing, the defectivity counts were measured by an Orbot® defectivity tool manufactured by Applied Materials. Table 6 below provides the defectivity data.

TABLE 6

|  | Micro-Scratch | Large Scratch | Total Inspection Count |
| --- | --- | --- | --- |
| Alkaline slurry | 2740 | 170 | 2989 |
| Composition 16 | 114 | 142 | 355 |

Figure 6:
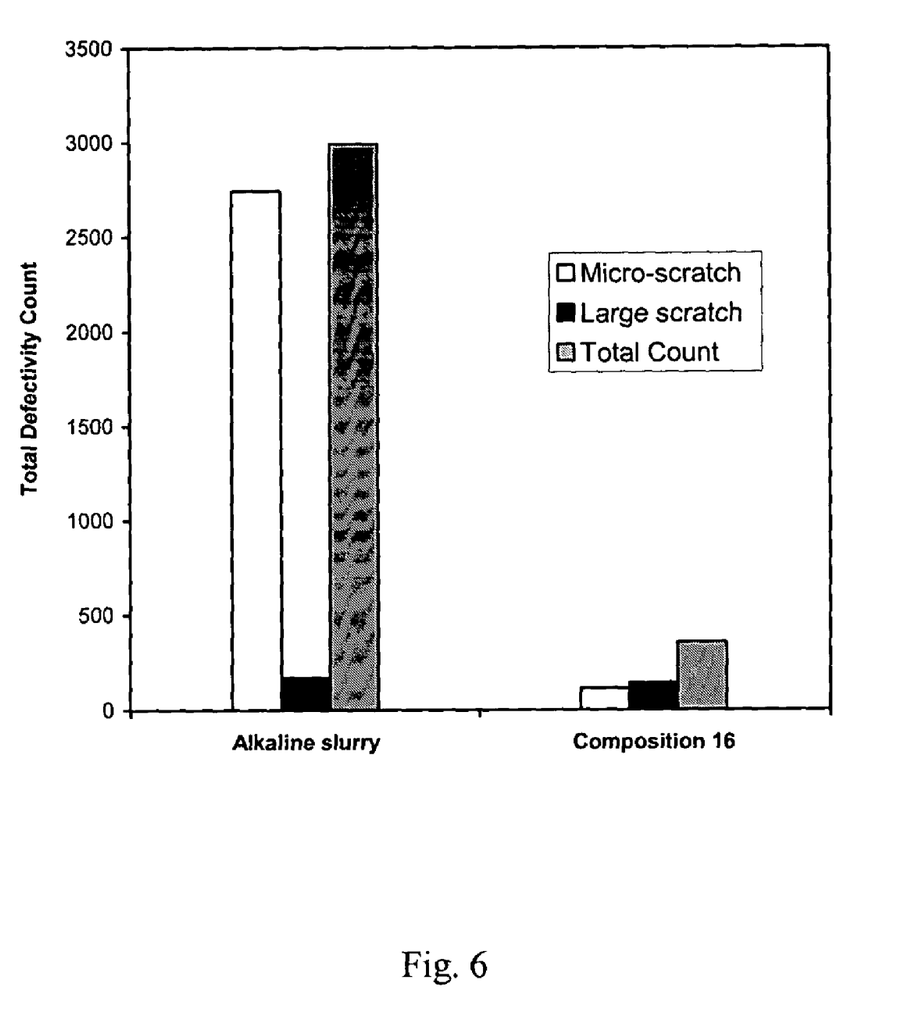
FIG. 6 is a graph illustrating defectivity comparison of copper sheet wafers between an alkaline conventional slurry and an acidic slurry containing an ammonium salt.

Table 6 shows the defect counts of the copper sheet wafer polished by composition 16 is significantly lower than that of the conventional alkaline slurry. FIG. 6 illustrates the dramatic improvement in defectivity achieved.

From the above experiments it may be seen that the use of the ammonium salts in the polishing compositions permits the differential removal rates for the silicon oxide-containing layers when compared with the removal rates for the barrier layers. This advantageously permits the rapid removal of one layer over another, such as TEOS in comparison to SiCN. For example, for a semiconductor having a mask layer and a cap layer, it optionally permits the selectivity of mask to cap to be greater than or equal to 3 to 1 or even greater than or equal to 10 to 1. The selectivity ratios are applicable to TEOS masks deposited on SiC, SiCO, $Si_3N_4$ or SiCN cap layers. They are also applicable to single masks as shown in the Table 6 below. The polishing composition can also advantageously be tuned to remove the silicon oxide-containing layer without any damage to the low k or ultra-low k dielectric layer. The ability of these polishing compositions to remove various layers of the semiconductor substrate without any damage to the silicon oxide-containing layer, the low k and/or ultra-low k dielectric layer is shown in the Table 7 below.

TABLE 7

| Integration Scheme # | Layer | Interconnect structures | Integration schemes for CMP | Removal Rate (RR) requirements |
| --- | --- | --- | --- | --- |
| 1 | Dual coatings | TaN/TEOS/SiCN/Low k or ultra-low k dielectric layer | Polish TaN and TEOS layers; stop polishing on SiCN and low k or ultra-low k dielectric layer | High RR for TaN and TEOS layers; Low RR for SiCN and low k or ultra-low k dielectric layer |
| 2 | Single coating | TaN/TEOS (or SiCN)/Low k or ultra-low k dielectric layer | Polish TaN and TEOS (or SiCN) layers; stop polishing on low k or ultra-low k dielectric layer | High RR for TaN and TEOS (or SiCN) layers; Low RR for low k or ultra-low k dielectric layer |
| 3 | Single coating | TaN/TEOS (or SiCN)/Low k or ultra-low k dielectric layer | Polish TaN layer; stop polishing on TEOS (or SiCN) and low k or | High RR for TaN; Low RR for TEOS (or SiCN) and low |

TABLE 7-continued

| Integration Scheme # | Layer | Interconnect structures | Integration schemes for CMP | Removal Rate (RR) requirements |
| --- | --- | --- | --- | --- |
| 4 | No coating | TaN/Low k or ultra-low k dielectric layer | ultra-low k dielectric layer Polish TaN layer; stop polishing on low k or ultra-low k dielectric layer | k or ultra-low k dielectric layer High RR for TaN; Low RR for low k or ultra-low k dielectric layer |

Table 7 shows various integration schemes that may be employed for selectively removing certain desired layers from a semiconductor substrate. For example, integration scheme 1 shows how the polishing composition may be advantageously utilized to selectively remove the TaN and TEOS layers from an interconnect structure comprising TaN, TEOS, SiCN and an ultra-low k dielectric layer respectively. The polishing composition removes the TaN and TEOS layer at a higher rate than the SiCN and CDO layer, thereby preserving the SiCN and the ultra-low k dielectric layer.

The polishing composition is utilized to adjust the removal rate of silicon oxide-containing layers and optionally barrier layers from interconnect structures in integrated circuit devices. It can be adjusted or tuned so as achieve a high silicon oxide-containing layer removal with reduced dishing to the interconnect metal or with stopping on a cap layer, such as a SiCN cap layer. Optionally, the method includes removing a barrier layer with the aqueous polishing composition before removing the silicon oxide-containing layer. In addition, if the silicon oxide-containing layer is a top TEOS layer deposited on a bottom layer and the bottom layer is a SiC, SiCN, $Si_3N_4$ or SiCO, then the composition can remove the top layer and leave at least a portion of the bottom layer. This selective TEOS removal is particularly effective for protecting low k and ultra-low k dielectrics with a cap layer.

We claim:
1. An aqueous polishing composition comprising:
a corrosion inhibitor for limiting removal of an interconnect metal;
an acidic pH;
abrasive particles; and
an organic-containing ammonium salt formed with

$R_1$, $R_2$, $R_3$ and $R_4$ are radicals, $R_1$ is an unsubstituted aryl, alkyl, aralkyl, or alkaryl group that has a carbon chain length of 2 to 15 carbon atoms and the organic-containing ammonium salt has a concentration that accelerates TEOS removal and decreases removal of at least one coating selected from the group consisting of SiC, SiCN, $Si_3N_4$ and SiCO with at least one polishing pressure less than 21.7 kPa.

2. The composition of claim 1, wherein $R_1$ has 2 to 5 carbon atoms.

3. The composition of claim 1, wherein the ammonium salt is formed with a compound selected from tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, metbacryloyloxyethyltrimethylammonium, 3-(methacrylamido) propyltrimethylammonium, triethylenetetramine, tetramethylguanidine, hexylamine and mixtures thereof.

4. An aqueous polishing composition comprising, by weight percent:
0.05 to 15 abrasive particles;
0 to 10 oxidizing agent;
0.0025 to 6 a corrosion inhibitor for limiting removal of an interconnect metal;
a pH of less than 5; and
0.001 to 3 organic-containing ammonium salt formed with $R_1$, $R_2$, $R_3$ and $R_4$ are radicals, $R_1$ is an unsubstituted aryl, alkyl, aralkyl, or alkaryl group that has a carbon chain length of 2 to 15 carbon atoms and the organic-containing ammonium salt has a concentration that accelerates TEOS removal and decreases removal of at least one coating selected from the group consisting of SiC, SiCN, $Si_3N_4$ and SiCO with at least one polishing pressure less than 21.7 kPa.

5. The composition of claim 4, wherein the abrasive comprises a silica, the oxidizing agent comprises hydrogen peroxide, the corrosion inhibitor comprises benzotriazole and the composition has a pH of less than 3 and an organic fluoride ammouium salt.

6. The composition of claim 5, wherein the polishing composition has a pH of 2 to 3 adjusted with nitric acid.

7. The composition of claim 4, wherein $R_1$ has a carbon chain length of 2 to 5.

8. An aqueous polishing composition comprising, by weight percent:
0.1 to 10 silica particles;
0 to 10 oxidizing agent;
0.25 to 4 benzotriazole;
a pH of 1.5 to 4 adjusted with an inorganic adjusting agent; and
0.02 to 2 organic-containing ammonium salt selected from at least one of tetraethyl ammonium salts, tetrabutylammonium salts, benzyltributylammonium salts, benzyltrimethylammonium salts and benzyltriethylammonum salts.

9. The composition of claim 8, wherein the organic-containing inorganic salt is a tetrabutylamonium salt.

10. The composition of claim 8, wherein the polishing composition has a pH of 2 to 3 adjusted with nitric acid.

* * * * *